(12) United States Patent
Abe et al.

(10) Patent No.: US 10,354,894 B2
(45) Date of Patent: Jul. 16, 2019

(54) LIGHT-IRRADIATION HEAT TREATMENT APPARATUS

(71) Applicant: SCREEN Holdings Co., Ltd., Kyoto (JP)

(72) Inventors: Makoto Abe, Kyoto (JP); Hikaru Kawarazaki, Kyoto (JP); Takahiro Yamada, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 6 days.

(21) Appl. No.: 15/410,999

(22) Filed: Jan. 20, 2017

(65) Prior Publication Data

US 2017/0243770 A1 Aug. 24, 2017

(30) Foreign Application Priority Data

Feb. 18, 2016 (JP) .................................. 2016-028883

(51) Int. Cl.
*H01L 21/67* (2006.01)
*H05B 3/00* (2006.01)

(52) U.S. Cl.
CPC .. *H01L 21/67115* (2013.01); *H01L 21/67248* (2013.01); *H05B 3/0047* (2013.01)

(58) Field of Classification Search
CPC ......... H01L 21/67115; H01L 21/67248; H05B 3/0047

(Continued)

(56) References Cited

U.S. PATENT DOCUMENTS 4,698,486 A 10/1987 Sheets
6,465,761 B2 * 10/2002 Stevens ................. C23C 16/481
118/501

(Continued)

FOREIGN PATENT DOCUMENTS

JP 60-258928 12/1985
JP 2005-527972 9/2005

(Continued)

OTHER PUBLICATIONS

Taiwan Office Action dated Dec. 14, 2017 with English translation of the Office Action based on Japanese translation. Portions relevant to prior-art based rejections are translated.

*Primary Examiner* — Shawntina T Fuqua
(74) *Attorney, Agent, or Firm* — Ostrolenk Faber LLP

(57) ABSTRACT

A semiconductor wafer held by a holder within a chamber is irradiated and heated with halogen light emitted from multiple halogen lamps. Cylindrical outer and inner louvers made of opaque quartz are provided between the halogen lamps and the semiconductor wafer. A reflector is provided in an area of tube walls of the halogen lamps that faces the spacing between the inner wall surface of the outer louver and the outer wall surface of the inner louver. The spacing between the two louvers is located immediately below and faces the peripheral portion of the semiconductor wafer. Thus, the illuminance of light that reaches the peripheral portion of the semiconductor wafer where a temperature drop is likely to occur will be higher than the illuminance of light that travels toward the central portion from the halogen lamps. This configuration will help make uniform the in-plane temperature distribution of the semiconductor wafer.

5 Claims, 12 Drawing Sheets

(58) Field of Classification Search
USPC .............. 219/390, 405, 411; 392/416, 418; 118/724, 725, 50.1
See application file for complete search history.

(56) References Cited

U.S. PATENT DOCUMENTS

| | | | |
|---|---|---|---|
| 6,891,131 B2* | 5/2005 | Sakuma | ............... C23C 16/481 |
| | | | 118/501 |
| 2003/0183612 A1 | 10/2003 | Timans et al. | |
| 2004/0069612 A1 | 4/2004 | Nakata et al. | ........... 204/157.15 |

FOREIGN PATENT DOCUMENTS

| | | |
|---|---|---|
| JP | 2014-120509 A | 6/2014 |
| TW | 200501232 A | 1/2005 |

* cited by examiner

F I G . 4
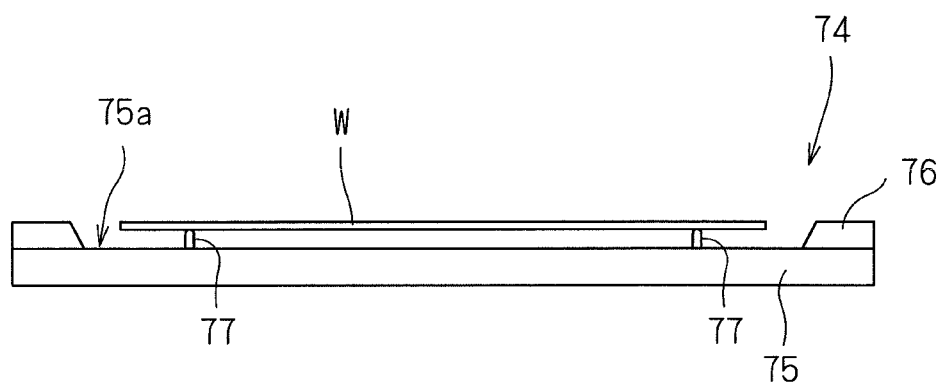

F I G . 5
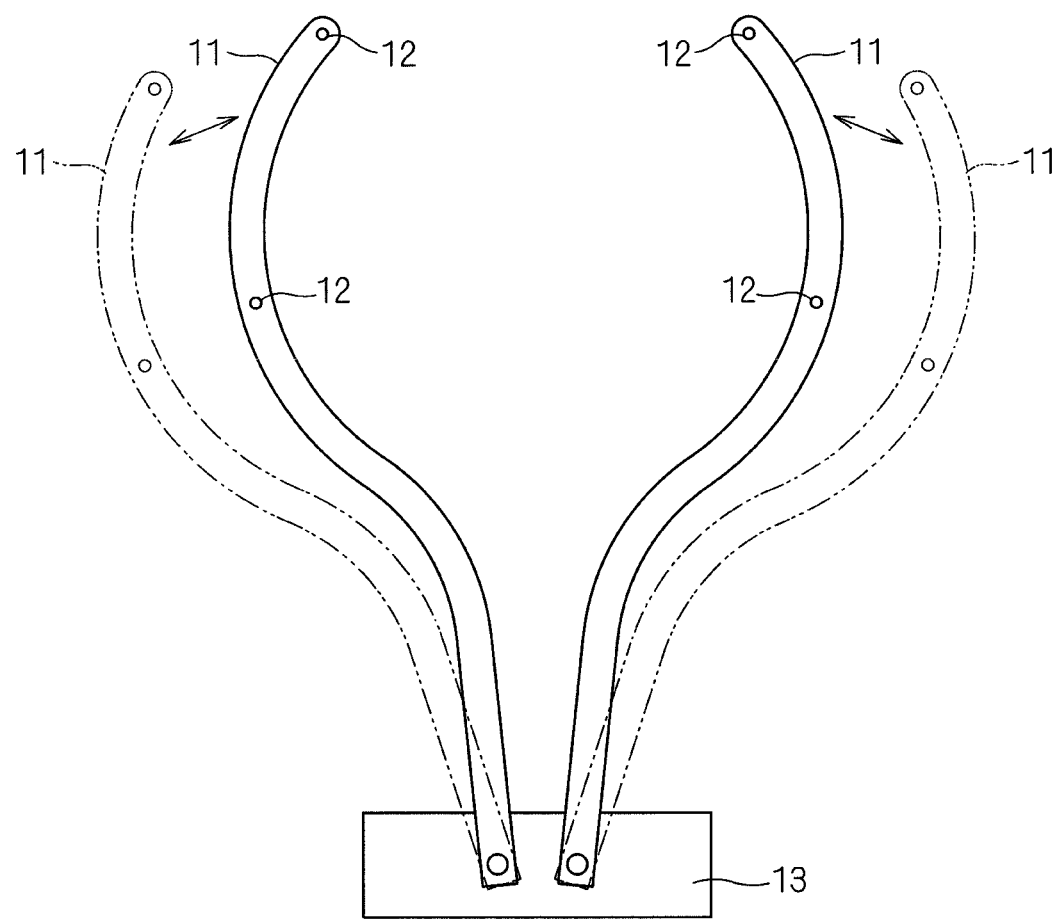

F I G. 6
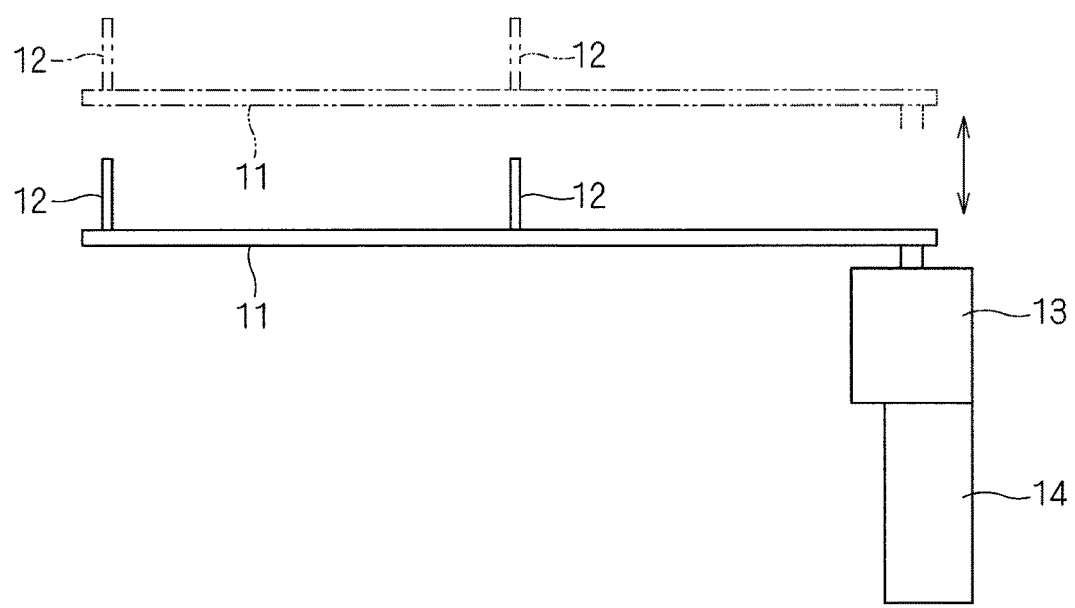

F I G. 7
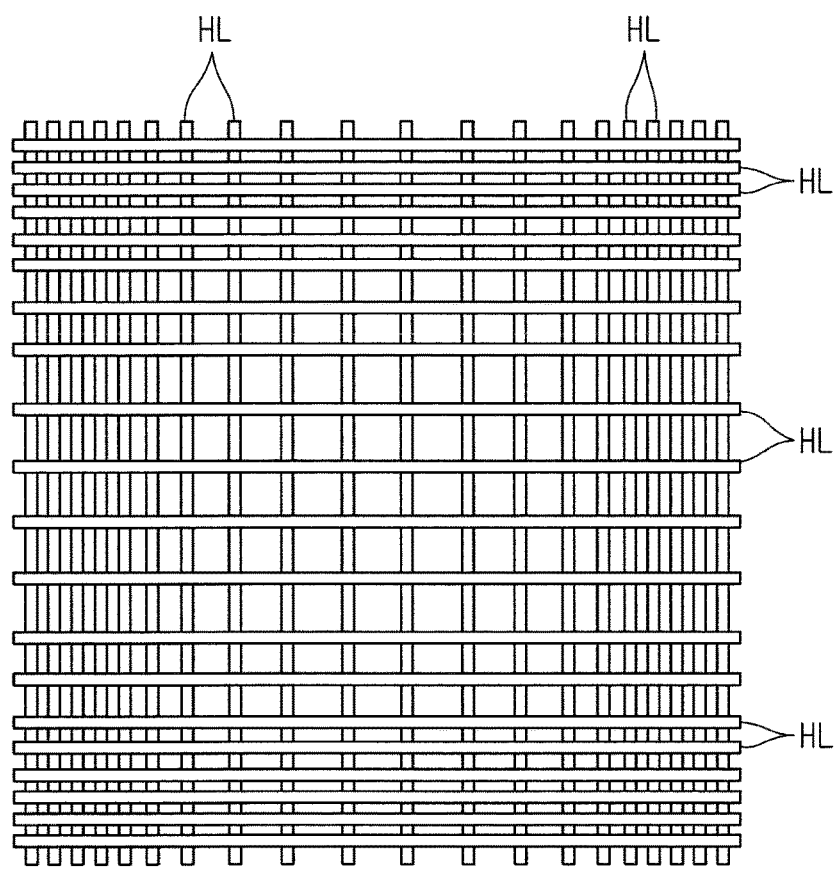

F I G. 1 1
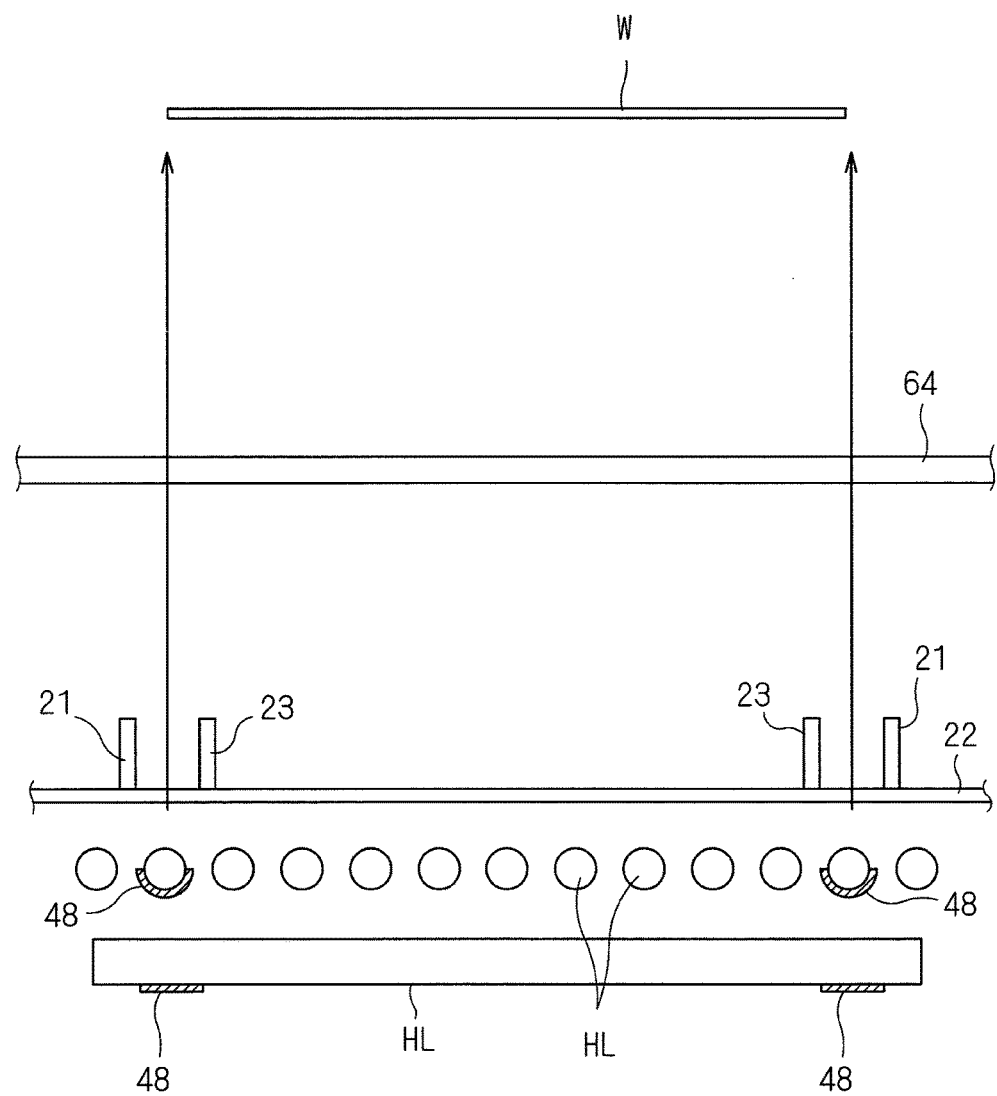

F I G . 1 2
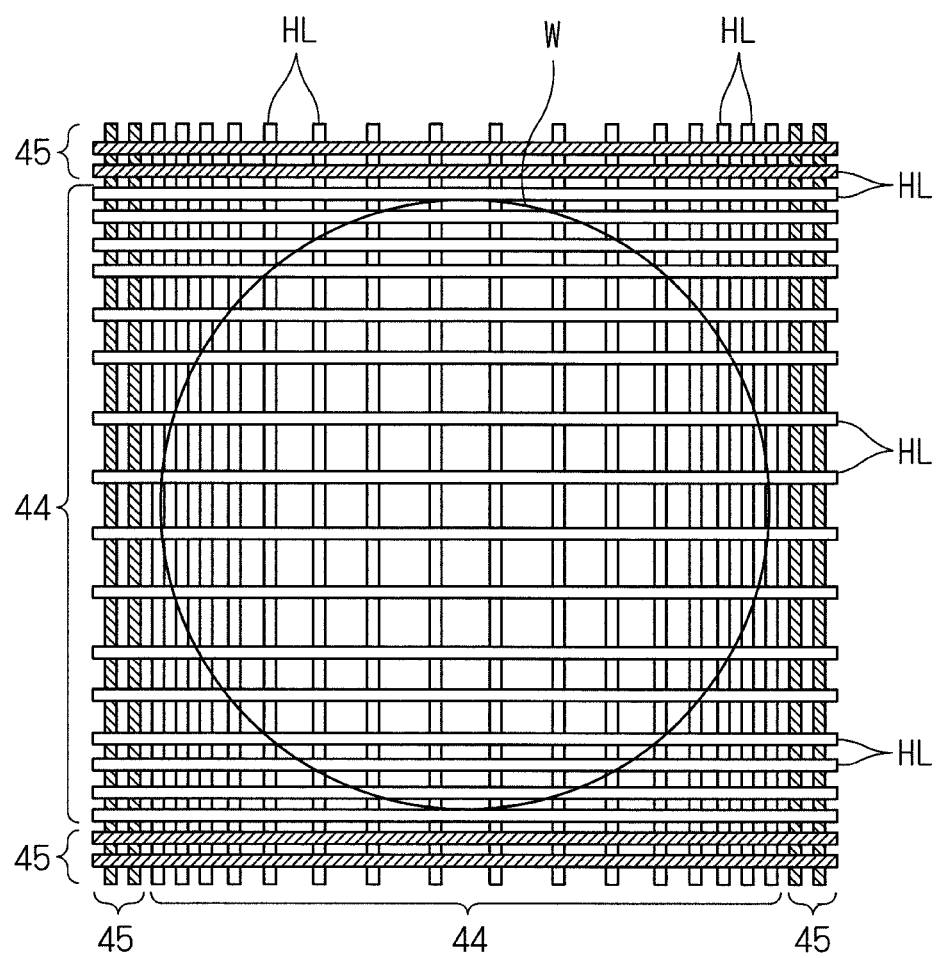

LIGHT-IRRADIATION HEAT TREATMENT APPARATUS

BACKGROUND OF THE INVENTION

Field of the Invention

The present invention relates to a heat treatment apparatus for heating a sheet precision electronic substrate (hereinafter, simply referred to as a "substrate"), such as a disk-shaped semiconductor wafer, by irradiating the substrate with light.

Description of the Background Art

In the process of manufacturing a semiconductor device, the introduction of impurities is an essential step for forming pn junctions in a semiconductor wafer. It is common at present to introduce impurities by ion implantation and subsequent annealing. Ion implantation is a technique for physically doping a semiconductor wafer with impurities by ionizing impurity elements, such as boron (B), arsenic (As), or phosphorus (P), and causing the impurity elements to collide with the semiconductor wafer with a high acceleration voltage. The doped impurities are activated by annealing. At this time, if the annealing time is about several seconds or longer, the doped impurities may be diffused deeply by heat, and as a result, the junction depth may become too deeper than required and compromise the formation of a good device.

In view of this, flash-lamp annealing (FLA) is recently receiving attention as an annealing technique for heating semiconductor wafers in an extremely short time. Flash-lamp annealing is a heat treatment technique using xenon flash lamps (hereinafter, sometimes simply referred to as "flash lamps") to irradiate a surface of an impurity-doped semiconductor wafer with flash light and raise the temperature of only the surface of the semiconductor wafer in an extremely short time (e.g., several milliseconds or less).

The radiation spectral distribution of xenon flash lamps ranges from ultraviolet to near-infrared regions, with the xenon flash lamps having shorter wavelengths than conventional halogen lamps, and approximately coincides with the fundamental absorption band of silicon semiconductor wafers. Thus, when xenon flash lamps emit flash light to a semiconductor wafer, less light will pass through the semiconductor wafer and accordingly the temperature of the semiconductor wafer will rise quickly. It is also known that extremely short-time application of flash light, such as several milliseconds or less, will only selectively increase the temperature in the vicinity of the surface of the semiconductor wafer. Such an extremely short-time temperature rise caused by the xenon flash lamps will only activate impurities without deeply diffusing the impurities.

Examples of the heat treatment apparatus using xenon flash lamps include those disclosed in U.S. Pat. No. 4,698,486 and US 2003/0183612, in which desired heat treatment is achieved by a combination of pulsed light-emitting lamps, such as flash lamps, that are arranged on the front side of a semiconductor wafer and continuous lighting lamps, such as halogen lamps, that are arranged on the rear side of the semiconductor wafer. In the heat treatment apparatuses disclosed in U.S. Pat. No. 4,698,486 and US 2003/0183612, a semiconductor wafer is preheated to a certain degree of temperature by, for example, halogen lamps and then heated to a desired processing temperature by pulse heating using flash lamps.

Preheating using the halogen lamps, as disclosed in U.S. Pat. No. 4,698,486 and US 2003/0183612, has a processing advantage that the semiconductor wafer will be preheated to a relatively high preheating temperature in a short time, but at the same time, it may produce hot spots having a higher temperature than surrounding areas or cold sports having a lower temperature than surrounding areas on the surface of the wafer. Thus, degradation of semiconductor device characteristics and a decrease in yield are of concern. In particular, preheating using halogen lamps is likely to cause a problem, such as the peripheral portion of the semiconductor wafer having a lower temperature than the central portion. Conceivable causes of this uneven temperature distribution include heat radiation from the peripheral portion of the semiconductor wafer, and heat conduction into a relatively low-temperature quartz susceptor from the peripheral portion of the semiconductor wafer.

SUMMARY OF THE INVENTION

The present invention is directed to a heat treatment apparatus for heating a disk-shaped substrate by irradiating the substrate with light.

According to an aspect of the present invention, the heat treatment apparatus includes a chamber that houses a substrate, a holder that holds the substrate within the chamber, a light irradiation part in which a plurality of rod-shaped lamps are arranged in a light source region that includes a region that faces a major surface of the substrate held by the holder, a cylindrical first louver that is provided between the light irradiation part and the holder, with a central axis of the first louver passing through a center of the substrate, and that is impervious to light emitted from the light irradiation part, and a cylindrical second louver that is provided between the light irradiation part and the holder, with a central axis of the second louver passing through the center of the substrate, and that is impervious to the light emitted from the light irradiation part. The first louver and the second louver have the same height. The first louver has an inner diameter that is greater than an outer diameter of the second louver. The second louver is provided inside the first louver. The first louver and the second louver are provided with a spacing between an inner wall surface of the first louver and an outer wall surface of the second louver, the spacing facing a peripheral portion of the substrate. A reflector that reflects light emitted from the plurality of rod-shaped lamps toward the spacing is provided in an area of lamp tube walls of the plurality of rod-shaped lamps that faces the spacing.

The heat treatment apparatus can relatively increase the illuminance of light that reaches the peripheral portion of the substrate where a temperature drop is likely to occur, thus making uniform the in-plane temperature distribution of the substrate.

According to another aspect of the present invention, the heat treatment apparatus includes a chamber that houses a substrate, a holder that holds the substrate within the chamber, and a light irradiation part in which a plurality of rod-shaped lamps are arranged in a light source region that includes a region that faces a major surface of the substrate held by the holder. Among the plurality of rod-shaped lamps, an outer lamp has a reflector on a lamp tube wall of the outer lamp, the reflector reflecting light emitted from the outer lamp toward the substrate, and the outer lamp being a lamp that does not completely overlap with the substrate as a whole in a longitudinal direction of the outer lamp in a plan view.

The heat treatment apparatus can relatively increase the illuminance of light that reaches the peripheral portion of the substrate where a temperature drop is likely to occur, thus making uniform the in-plane temperature distribution of the substrate.

Thus, an object of the present invention is to make uniform the in-plane temperature distribution of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the susceptor;

FIG. 5 is a plan view of a transfer mechanism;

FIG. 6 is a side view of the transfer mechanism;

FIG. 7 is a plan view illustrating the arrangement of multiple halogen lamps;

FIG. 11 illustrates how optical paths are adjusted by the outer and inner louvers and the reflectors; and FIG. 12 illustrates halogen lamps provided with reflectors according to a third preferred embodiment.

DESCRIPTION OF THE PREFERRED EMBODIMENTS

Hereinafter, preferred embodiments of the present invention will be described in detail with reference to the drawings.

First Preferred Embodiment

Figure 1:
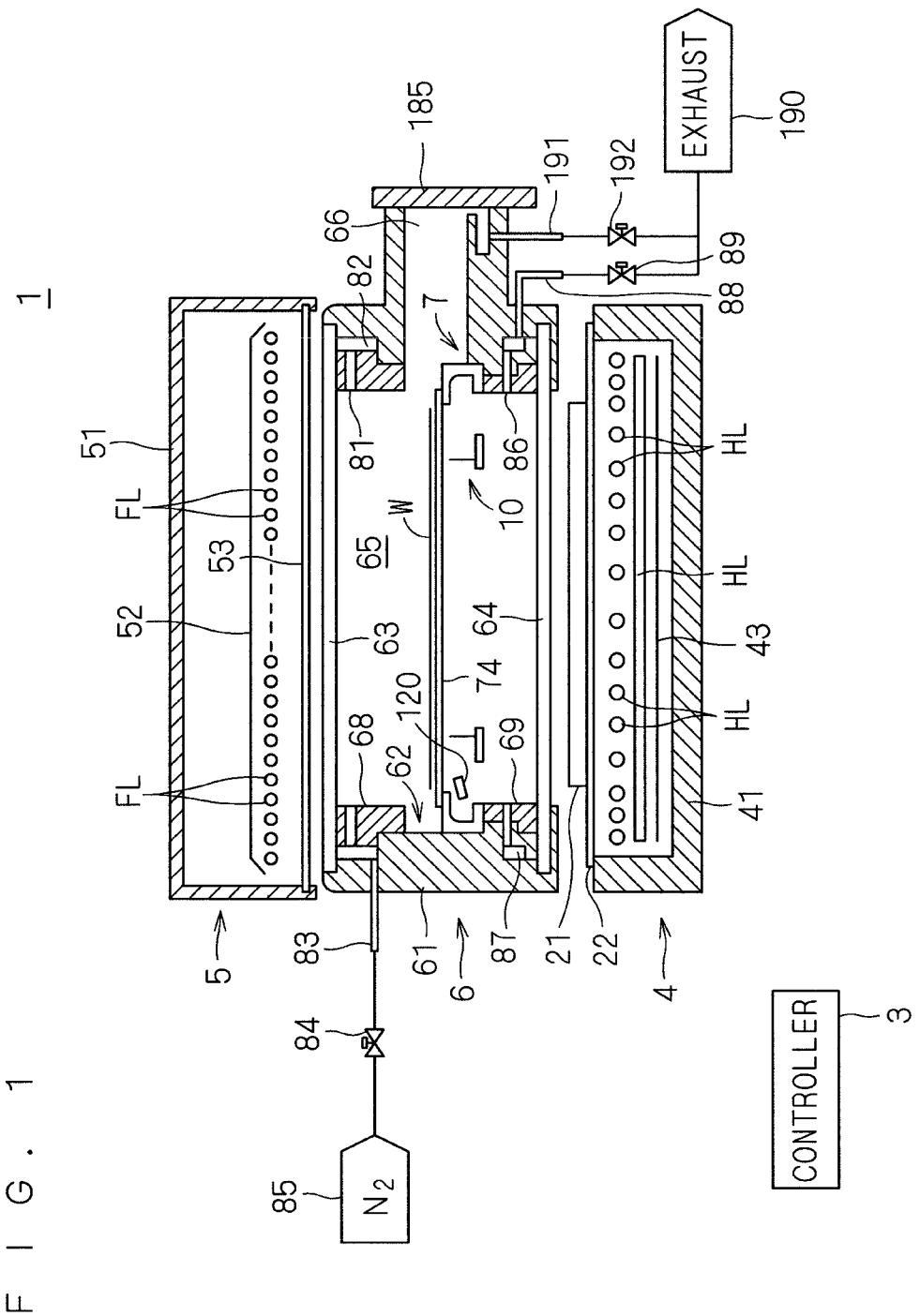
FIG. 1 is a longitudinal cross-sectional view of a configuration of a heat treatment apparatus according to the present invention.

FIG. 1 is a longitudinal cross-sectional view of a configuration of a heat treatment apparatus 1 according to the present invention. The heat treatment apparatus 1 of the present preferred embodiment is a flash-lamp annealing apparatus for heating a disk-shaped semiconductor wafer W, which is a substrate, by irradiating the semiconductor wafer W with flash light. The size of the semiconductor wafer W to be processed is not particularly limited and may have a diameter of, for example, φ300 mm or φ450 mm (in the present preferred embodiment, φ300 mm). The semiconductor wafer W is doped with impurities before being conveyed into the heat treatment apparatus 1, and the doped impurities are activated by heat treatment performed by the heat treatment apparatus 1. For easy understanding of drawings, the dimensions of each constituent element and the number of constituent elements in FIG. 1 and subsequent drawings may be exaggerated or simplified as necessary.

The heat treatment apparatus 1 includes a chamber 6 that houses the semiconductor wafer W, a flash heater 5 that includes multiple built-in flash lamps FL, and a halogen heater 4 that includes multiple built-in halogen lamps HL. The flash heater 5 is located above the chamber 6, and the halogen heater 4 is located below the chamber 6. The heat treatment apparatus 1 further includes, within the chamber 6, a holder 7 that holds the semiconductor wafer W in a horizontal position and a transfer mechanism 10 for transferring the semiconductor wafer W between the holder 7 and the outside of the heat treatment apparatus 1. The heat treatment apparatus 1 further includes a controller 3 that controls operating mechanisms provided in the halogen heater 4, the flash heater 5, and the chamber 6 to perform the heat treatment of the semiconductor wafer W.

The chamber 6 is configured by mounting quartz chamber windows on the top and bottom of a tubular chamber side portion 61. The chamber side portion 61 has a roughly tubular shape that is open at the top and the bottom, the opening at the top being equipped with and closed by an upper chamber window 63 and the opening at the bottom being equipped with and closed by a lower chamber window 64. The upper chamber window 63, which forms the ceiling of the chamber 6, is a disk-shaped member made of quartz and functions as a quartz window that allows the flash light emitted from the flash heater 5 to pass through it into the chamber 6. The lower chamber window 64, which forms the floor of the chamber 6, is also a disk-shaped member made of quartz and functions as a quartz window that allows the light emitted from the halogen heater 4 to pass through it into the chamber 6.

A reflection ring 68 is mounted on the upper part of the inner wall surface of the chamber side portion 61, and a reflection ring 69 is mounted on the lower part thereof. Both of the reflection rings 68 and 69 have a ring shape. The upper reflection ring 68 is mounted by being fitted from above the chamber side portion 61. The lower reflection ring 69 is mounted by being fitted from below the chamber side portion 61 and fastened with screws (not shown). That is, the reflection rings 68 and 69 are both removably mounted on the chamber side portion 61. The chamber 6 has an inner space that is surrounded by the upper chamber window 63, the lower chamber window 64, the chamber side portion 61, and the reflection rings 68 and 69 and defined as a heat treatment space 65.

The presence of the reflection rings 68 and 69 on the chamber side portion 61 generates a recessed portion 62 in the inner wall surface of the chamber 6. That is, the recessed portion 62 is surrounded by a central portion of the inner wall surface of the chamber side portion 61 on which the reflection rings 68 and 69 are not mounted, the lower end surface of the reflection ring 68, and the upper end surface of the reflection ring 69. The recessed portion 62 has a ring shape extending in a horizontal direction along the inner wall surface of the chamber 6, and surrounds the holder 7 that holds the semiconductor wafer W.

The chamber side portion 61 and the reflection rings 68 and 69 are each made of a metal material (e.g., stainless steel) having excellent strength and heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable by a gate valve 185. The transport opening 66 is communicatively connected to the outer circumferential surface of the recessed portion 62. Thus, when the gate valve 185 opens the transport opening 66, the semiconductor wafer W can be transported into and out of the heat treatment space 65 from the transport opening 66 through the recessed portion 62. When the gate valve 185 closes the transport opening 66, the heat treatment space 65 in the chamber 6 becomes an enclosed space.

The upper part of the inner wall of the chamber 6 has a gas supply port 81 through which a process gas (in the present preferred embodiment, nitrogen gas ($N_2$)) is supplied to the heat treatment space 65. The gas supply port 81 is located at a position above the recessed portion 62 and may be provided in the reflection ring 68. The gas supply port 81 is communicatively connected to a gas supply pipe 83 through a buffer space 82 that is formed in a ring shape inside the side wall of the chamber 6. The gas supply pipe 83 is connected to a nitrogen gas supply source 85. A valve 84 is interposed in the path of the gas supply pipe 83. When the valve 84 is open, a nitrogen gas is supplied from the gas supply source 85 to the buffer space 82. The nitrogen gas flowing into the buffer space 82 flows throughout the buffer space 82, which has lower fluid resistance than the gas supply port 81, and is supplied from the gas supply port 81 into the heat treatment space 65. Note that the process gas is not limited to a nitrogen gas, and may be an inert gas such as argon (Ar) or helium (He), or a reactive gas such as oxygen ($O_2$), hydrogen ($H_2$), chlorine ($Cl_2$), hydrogen chloride (HCl), ozone ($O_3$), or ammonia ($NH_3$).

On the other hand, the lower part of the inner wall of the chamber 6 has a gas exhaust port 86 from which the gas in the heat treatment space 65 is exhausted. The gas exhaust port 86 is located at a position below the recessed portion 62 and may be provided in the reflection ring 69. The gas exhaust port 86 is communicatively connected to a gas exhaust pipe 88 through a buffer space 87 that is formed in a ring shape inside the side wall of the chamber 6. The gas exhaust pipe 88 is connected to an exhaust part 190. A valve 89 is interposed in the path of the gas exhaust pipe 88. When the valve 89 is open, the gas in the heat treatment space 65 is exhausted from the gas exhaust port 86 through the buffer space 87 to the gas exhaust pipe 88. Alternatively, multiple gas supply ports 81 and multiple gas exhaust ports 86 may be provided in the direction along the circumference of the chamber 6, or the gas supply port 81 and the gas exhaust port 86 may be slit-shaped. The nitrogen gas supply source 85 and the exhaust part 190 may be mechanisms provided in the heat treatment apparatus 1, or may be utilities in a factory where the heat treatment apparatus 1 is installed.

One end of the transport opening 66 is connected to a gas exhaust pipe 191 from which the gas in the heat treatment space 65 is exhausted. The gas exhaust pipe 191 is connected via a valve 192 to the exhaust part 190. When the valve 192 is open, the gas in the chamber 6 is exhausted from the transport opening 66.

Figure 2:
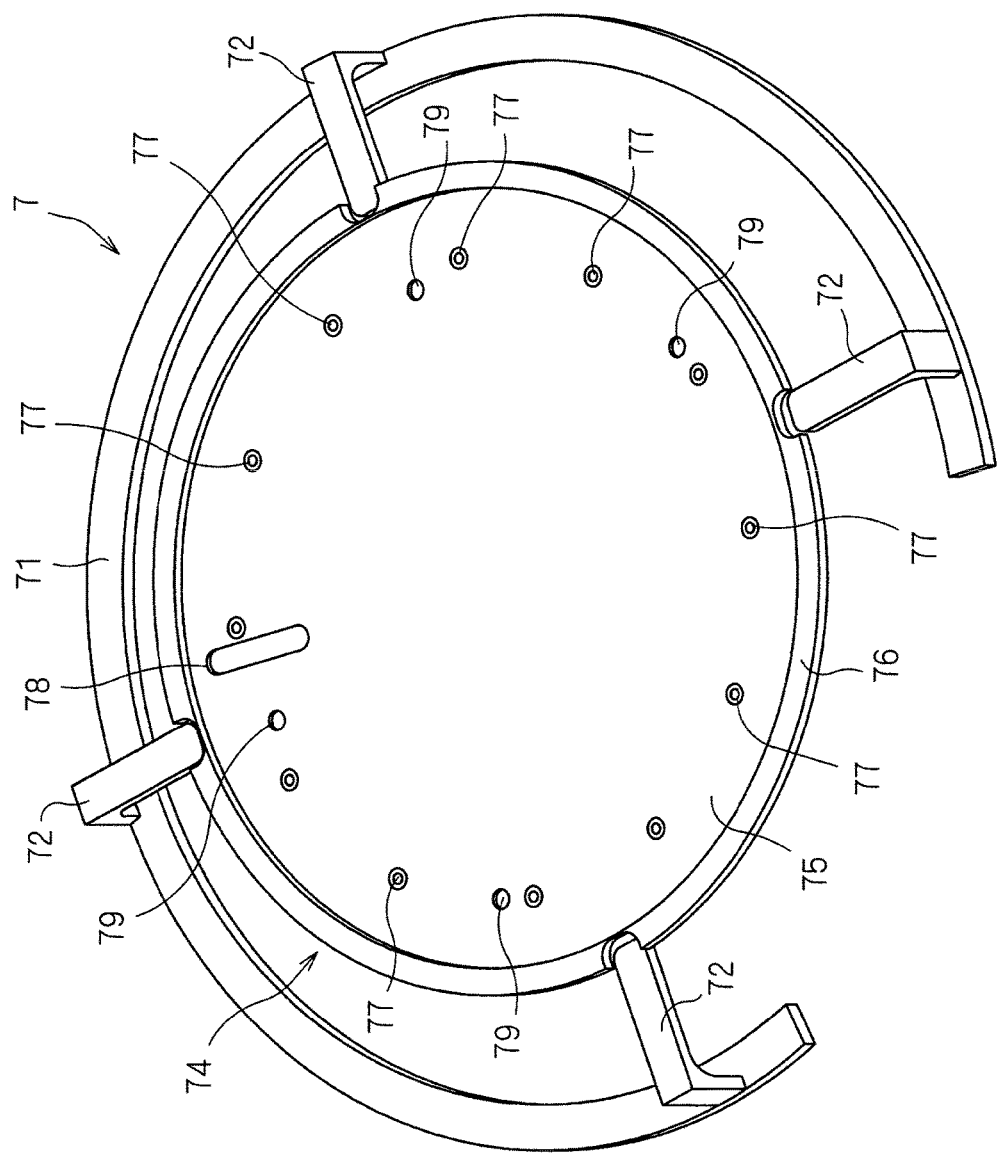
FIG. 2 is a perspective view of the overall external appearance of a holder.

FIG. 2 is a perspective view of the overall external appearance of the holder 7. The holder 7 is constituted by a base ring 71, connecting parts 72, and a susceptor 74. The base ring 71, the connecting parts 72, and the susceptor 74 are all made of quartz. That is, the holder 7 as a whole is made of quartz.

The base ring 71 is a quartz member having an arc shape that is a ring shape having a missing portion. The missing portion is provided in order to avoid interference between the base ring 71 and transfer arms 11 of the transfer mechanism 10, which will be described later. The base ring 71 is placed on the bottom surface of the recessed portion 62 and thereby supported by the wall surface of the chamber 6 (see FIG. 1). The upper surface of the base ring 71 has the multiple (in the present preferred embodiment, four) upright connecting parts 72 arranged along the circumference of the base ring 71. The connecting parts 72 are also quartz members and fixedly attached to the base ring 71 by welding.

Figure 3:
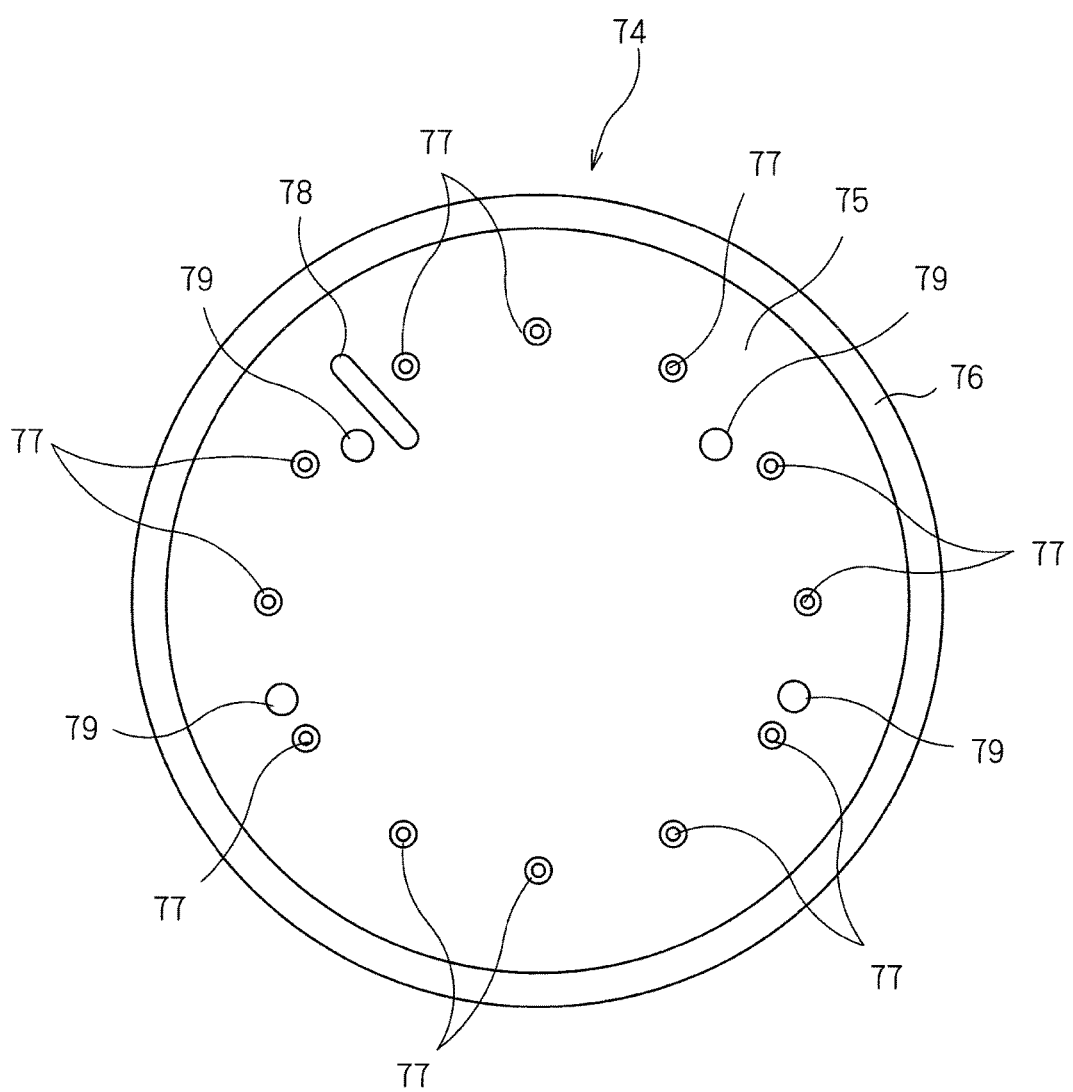
FIG. 3 is a plan view of a susceptor.

The susceptor 74 is supported by the four connecting parts 72 provided on the base ring 71. FIG. 3 is a plan view of the susceptor 74. FIG. 4 is a cross-sectional view of the susceptor 74. The susceptor 74 includes a holding plate 75, a guide ring 76, and multiple substrate support pins 77. The holding plate 75 is a substantially circular flat plate-like member made of quartz. The diameter of the holding plate 75 is greater diameter than the diameter of the semiconductor wafer W. That is, the holding plate 75 has a greater plane size than the semiconductor wafer W.

The guide ring 76 is provided on the periphery of the upper surface of the holding plate 75. The guide ring 76 is a ring-shaped member having a greater inner diameter than the diameter of the semiconductor wafer W. For example, when the semiconductor wafer W has a diameter of φ300 mm, the inner diameter of the guide ring 76 is φ320 mm. The inner periphery of the guide ring 76 is a tapered surface that tapers upward from the holding plate 75. The guide ring 76 is made of quartz similar to that of the holding plate 75. The guide ring 76 may be welded to the upper surface of the holding plate 75, or may be fixed to the holding plate 75 with pins that are processed separately or by other means. Alternatively, the holding plate 75 and the guide ring 76 may be processed as an integral member.

A region of the upper surface of the holding plate 75 that is inward of the guide ring 76 serves as a flat plate-like holding surface 75a on which the semiconductor wafer W is held. The multiple substrate support pins 77 are provided upright on the holding surface 75a of the holding plate 75. In the present preferred embodiment, 12 substrate support pins 77 in total are provided upright at an interval of 30 degrees along the circumference of a circle that is concentric with the outer circumferential circle of the holding surface 75a (or the inner circumferential circle of the guide ring 76). The diameter of the circle along which the 12 substrate support pins 77 are provided (i.e., the distance between opposing substrate support pins 77) is smaller than the diameter of the semiconductor wafer W, and may be in the range of φ270 mm to φ280 mm (in the present preferred embodiment, φ280 mm) when the semiconductor wafer W has a diameter of φ300 mm. Each substrate support pin 77 is made of quartz. The multiple substrate support pins 77 may be provided by welding on the upper surface of the holding plate 75, or may be processed integrally with the holding plate 75.

Referring back to FIG. 2, the four connecting parts 72 provided upright on the base ring 71 and the peripheral portion of the holding plate 75 of the susceptor 74 are fixedly attached to each other by welding. That is, the susceptor 74 and the base ring 71 are fixedly coupled to each other by the connecting parts 72. The base ring 71 of the holder 7 is supported by the wall surface of the chamber 6, and thereby the holder 7 is mounted on the chamber 6. With the holder 7 mounted on the chamber 6, the holding plate 75 of the susceptor 74 is held in a horizontal position (position at which the normal coincides with the vertical direction). That is, the holding surface 75a of the holding plate 75 becomes horizontal.

The semiconductor wafer W transported into the chamber 6 is placed and held in a horizontal position on the susceptor 74 of the holder 7 mounted on the chamber 6. At this time, the semiconductor wafer W is supported by the 12 substrate support pins 77 provided upright on the holding plate 75 and is held by the susceptor 74. To be exact, the upper ends of the 12 substrate support pins 77 come in contact with the lower surface of the semiconductor wafer W and support the semiconductor wafer W. Since the 12 substrate support pins 77 have the same height (the same distance from the upper ends of the substrate support pins 77 to the holding surface 75a of the holding plate 75), they can support the semiconductor wafer W in a horizontal position.

The semiconductor wafer W is supported by the multiple substrate support pins 77, with a predetermined spacing from the holding surface 75a of the holding plate 75. The guide ring 76 has a thickness greater than the height of the substrate support pins 77. Thus, the presence of the guide ring 76 prevents the semiconductor wafer W supported by the multiple substrate support pins 77 from being misaligned in the horizontal direction.

As illustrated in FIGS. 2 and 3, the holding plate 75 of the susceptor 74 has a vertically penetrating opening 78. The opening 78 is provided to allow a radiation thermometer 120 (see FIG. 1) to receive radiation light (infrared light) radiated from the underside of the semiconductor wafer W held by the susceptor 74. That is, the radiation thermometer 120 receives the light radiated from the underside of the semiconductor wafer W held by the susceptor 74 through the opening 78, and the temperature of the semiconductor wafer W is measured with a separate-type detector. The holding plate 75 of the susceptor 74 further has four through holes 79 that allow lift pins 12 of the transfer mechanism 10, which will be described later, to pass through them for transfer of the semiconductor wafer W.

FIG. 5 is a plan view of the transfer mechanism 10. FIG. 6 is a side view of the transfer mechanism 10. The transfer mechanism 10 includes two transfer arms 11. The transfer arms 11 have an arc shape that extends along the substantially ring-shaped recessed portion 62. Each transfer arm 11 has two upright lift pins 12 and is pivotable by a horizontal movement mechanism 13. The horizontal movement mechanism 13 horizontally moves the pair of transfer arms 11 between a transfer operation position (position indicated by the solid line in FIG. 5) at which the semiconductor wafer W is transferred to the holder 7 and a retracted position (position indicated by the dashed double-dotted line in FIG. 5) at which the transfer arms 11 do not overlap with the semiconductor wafer W held by the holder 7 in a plan view. The horizontal movement mechanism 13 may be a mechanism for pivoting each transfer arm 11 separately by an individual motor, or may be a mechanism for using a link mechanism to pivot the pair of transfer arms 11 in conjunction with each other by a single motor.

The pair of transfer arms 11 are also movable up and down along with the horizontal movement mechanism 13 by an elevating mechanism 14. When the elevating mechanism 14 moves the pair of transfer arms 11 upward at the transfer operation position, the four lift pins 12 in total pass through the through holes 79 (see FIGS. 2 and 3) of the susceptor 74 so that the upper ends of the lift pins 12 protrude from the upper surface of the susceptor 74. On the other hand, when the elevating mechanism 14 moves the pair of transfer arms 11 downward at the transfer operation position to pull the lift pins 12 out of the through holes 79 and the horizontal movement mechanism 13 moves the pair of transfer arms 11 so as to open the transfer arms 11, each transfer arm 11 moves to its retracted position. The retracted positions of the pair of transfer arms 11 are directly above the base ring 71 of the holder 7. Since the base ring 71 is placed on the bottom surface of the recessed portion 62, the retracted positions of the transfer arms 11 are inside the recessed portion 62. Note that an exhaust mechanism (not shown) is also provided in the vicinity of an area where the driving part (the horizontal movement mechanism 13 and the elevating mechanism 14) of the transfer mechanism 10 is provided, in order to allow the atmosphere around the driving part of the transfer mechanism 10 to be exhausted to the outside of the chamber 6.

Referring back to FIG. 1, the flash heater 5 provided above the chamber 6 includes, within a casing 51, a light source that includes multiple (in the present preferred embodiment, 30) xenon flash lamps FL, and a reflector 52 that is provided to cover the top of the light source. The casing 51 of the flash heater 5 also has a lamp-light radiating window 53 mounted on the bottom. The lamp-light radiating window 53, which forms the floor of the flash heater 5, is a plate-like quartz window made of quartz. Since the flash heater 5 is located above the chamber 6, the lamp-light radiating window 53 faces the upper chamber window 63. The flash lamps FL emit flash light from above the chamber 6 to the heat treatment space 65 through the lamp light irradiation window 53 and the upper chamber window 63.

The multiple flash lamps FL are rod-shaped lamps, each having an elongated cylindrical shape, and are arrayed in a plane such that their longitudinal directions are parallel to one another along the major surface of the semiconductor wafer W held by the holder 7 (i.e., in the horizontal direction). Thus, a plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing a xenon gas sealed therein and including an anode and a cathode that are disposed at opposite ends of the glass tube and connected to a capacitor. Since the xenon gas serves electrically as an insulator, no electricity will flow within the glass tube under normal conditions even if the capacitor stores electric charge. However, if an electrical breakdown has occurred due to the application of a high voltage to the trigger electrode, the electricity stored in the capacitor will instantaneously flow within the glass tube, and light will be emitted by the excitation of xenon atoms or molecules at that time. These xenon flash lamps FL have the properties of being able to apply extremely intense light, as compared with light sources for continuous lighting such as halogen lamps HL, because the electrostatic energy stored in advance in the capacitor is converted into an extremely short optical pulse of 0.1 to 100 milliseconds. That is, the flash lamps FL are pulsed light-emitting lamps that emit light instantaneously for an extremely short time (e.g., less than one second). Note that the light emission time of the flash lamps FL may be adjusted by using the coil constant of a lamp source that supplies power to the flash lamps FL.

The reflector 52 is provided above the multiple flash lamps FL to cover the whole of the flash lamps FL. The reflector 52 has a basic function of reflecting the flash light emitted from the multiple flash lamps FL toward the heat treatment space 65. The reflector 52 is made of an aluminum alloy plate, and the surface (surface facing the flash lamps FL) of the reflector 52 is roughened by blasting.

The halogen heater 4 located below the chamber 6 includes the multiple (in the present preferred embodiment, 40) build-in halogen lamps HL within a casing 41. The halogen heater 4 is a light irradiation part that causes the multiple halogen lamps HL to emit light from the underside of the chamber 6 to the heat treatment space 65 through the lower chamber window 64 and to heat the semiconductor wafer W.

FIG. 7 is a plan view illustrating the arrangement of the multiple halogen lamps HL. In the first preferred embodiment, the multiple halogen lamps HL are arranged in a region that is larger than the main surface of the disk-shaped semiconductor wafer W held by the holder 7 (i.e., 300-mm diameter circle when the semiconductor wafer W has a diameter of ϕ300 mm). The multiple halogen lamps HL are also arranged in a light source region that includes a region facing the lower main surface of the semiconductor wafer W.

As illustrated in FIGS. 1 and 7, the 40 halogen lamps HL in the first preferred embodiment are divided into and arranged in upper and lower rows. The upper row, which is closer to the holder 7, includes an array of 20 halogen lamps HL, and the lower row, which is further to the holder 7 than the upper row, includes an array of 20 halogen lamps HL. Each halogen lamp HL is a rod-shaped lamp having an elongated cylindrical shape. The 20 halogen lamps HL in each of the upper and lower rows are arranged such that their longitudinal directions are parallel to one another along the major surface of the semiconductor wafer W held by the holder 7 (i.e., in the horizontal direction). Thus, a plane formed by the array of the halogen lamps HL in the upper row and a plane formed by the array of the halogen lamps HL in the lower row are both horizontal planes.

As illustrated in FIG. 7, in both of the upper and lower rows, the density of arrangement of the halogen lamps HL in a region that faces the peripheral portion of the semiconductor wafer W held by the holder 7 is higher than that in a region that faces the central portion of the semiconductor wafer W. That is, in both of the upper and lower rows, the halogen lamps HL in the peripheral portion of the light source region are arranged at a shorter pitch than those in the central portion. This increases the amount of light applied to the peripheral portion of the semiconductor wafer W where a temperature drop is likely to occur, during heating with the light applied from the halogen heater 4.

A lamp group of the upper row of halogen lamps HL and a lamp group of the lower row of halogen lamps HL are arranged so as to intersect each other in a grid-like pattern. That is, the 40 halogen lamps HL in total are arranged such that the direction along the lengths of the upper row of 20 halogen lamps HL and the direction along the lengths of the lower row of 20 halogen lamps HL are orthogonal to each other.

The halogen lamps HL are filament-type light sources that make the filament disposed in the glass tube incandescent and emit light by applying current to the filament. The glass tube contains a gas that is produced by introducing a trace amount of halogen elements (e.g., iodine or bromine) into an inert gas such as nitrogen or argon. The introduction of halogen elements will help set the temperature of the filament to a high value while suppressing breakage of the filament. Thus, the halogen lamps HL have the properties of having a longer life than typical incandescent lamps and being able to apply intense light continuously. That is, the halogen lamps HL are continuous lighting lamps that continuously emit light for at least one second. The halogen lamps HL are also long-life because of their rod-like shape, and when arranged in the horizontal direction, exhibits excellent efficiency in the radiation of the semiconductor wafer W located above the halogen lamps.

The halogen heater 4 also includes, within the casing 41, a reflector 43 that is located under the two rows of halogen lamps HL (FIG. 1). The reflector 43 reflects the light emitted from the multiple halogen lamps HL toward the heat treatment space 65.

Figure 8:
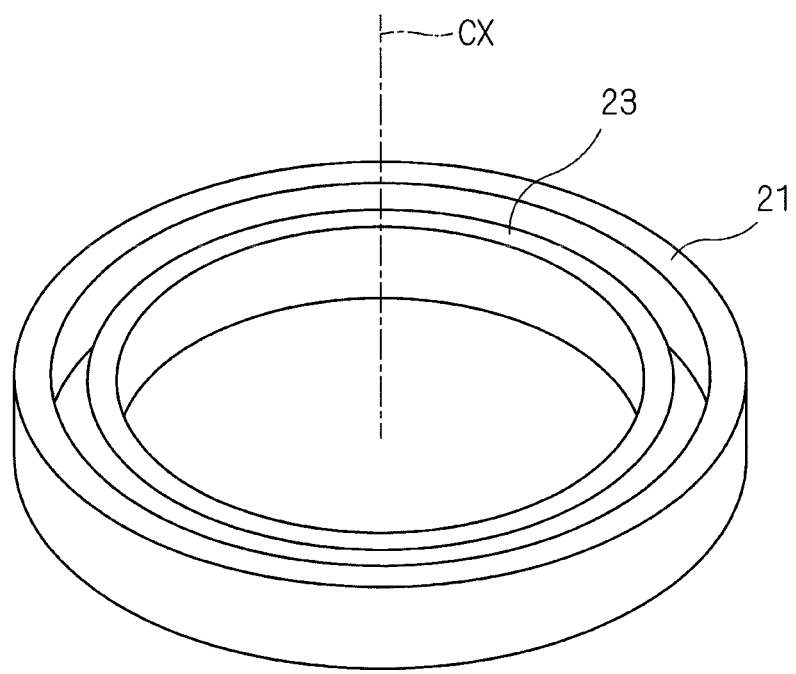
FIG. 8 is a perspective view of an outer louver and an inner louver.

Two louvers, namely, an outer louver 21 and an inner louver 23, are provided between the halogen heater 4 and the holder 7. FIG. 8 is a perspective view of the outer louver 21 and the inner louver 23. The outer louver 21 and the inner louver 23 are both cylindrical (bottomless cylindrical) members having upper and lower open ends. The outer louver 21 and the inner louver 23 are made of a material that is impervious to the light emitted from the halogen lamps HL of the halogen heater 4, such as opaque quartz with a large number of superfine air bubbles contained in silica glass.

As illustrated in FIG. 1, a louver stage 22 is provided on the top of the casing 41 of the halogen heater 4. The louver stage 22 is a flat plate-like member made of silica glass that is transparent to the light emitted from the halogen lamps HL. The outer louver 21 and the inner louver 23 are installed on the upper surface of this louver stage 22. That is, the outer louver 21 and the inner louver 23 are installed below the lower chamber window 64 and outside the chamber 6.

The outer louver 21 and the inner louver 23 are installed such that a central axis CX of their cylinders passes through the center of the semiconductor wafer W held by the holder 7. That is, the outer louver 21 and the inner louver 23 are concentrically disposed on the louver stage 22 in a plan view. The multiple halogen lamps HL of the halogen heater 4 are arranged in the light source region that includes the region facing the lower surface of the semiconductor wafer W held by the holder 7. Thus, the central axis CX of the outer louver 21 and the inner louver 23 also passes through the center of the array of the halogen lamps HL.

The diameter of the cylinder of the outer louver 21 is greater than the diameter of the semiconductor wafer W. In the present preferred embodiment, the outer louver 21 has, for example, an outer diameter of 323 mm and an inner diameter of 317 mm. That is, the diameter of the outer louver 121 from the center of the thickness of the cylinder wall is 320 mm.

On the other hand, the diameter of the cylinder of the inner louver 23 is smaller than the diameter of the semiconductor wafer W. In the present preferred embodiment, the inner louver 23 has, for example, an outer diameter of 283 mm and an inner diameter of 277 mm. That is, the diameter of the inner louver 23 from the center of the thickness of the cylinder wall is 280 mm.

In this way, the inner diameter of the outer louver 21 is greater than the outer diameter of the inner louver 23. Thus, the inner louver 23 is installed inside the outer louver 21 on the upper surface of the louver stage 22 as illustrated in FIG. 8. The outer louver 21 and the inner louver 23 have the same height of, for example, 15 mm to 25 mm (in the present preferred embodiment, 23 mm).

With the inner louver 23 disposed inside the outer louver 21, a cylindrical spacing is provided between the inner wall surface of the outer louver 21 and the outer wall surface of the inner louver 23. The outer diameter of the cylindrical spacing (i.e., the inner diameter of the outer louver 121) is 317 mm, and the inner diameter of the spacing (i.e., the outer diameter of the inner louver 123) is 283 mm. That is, the cylindrical spacing between the inner wall surface of the outer louver 121 and the outer wall surface of the inner louver 123 is 17 mm, and the diameter of the cylindrical spacing from the center in the radial direction is 300 mm, which is the same as the diameter of the semiconductor wafer W. In other words, the center of the spacing between the inner wall surface of the outer louver 121 and the outer wall surface of the inner louver 123 is located immediately below the edge of the semiconductor wafer W held by the holder 7, and the spacing faces the peripheral portion of the semiconductor wafer W held by the holder 7.

Figure 9:
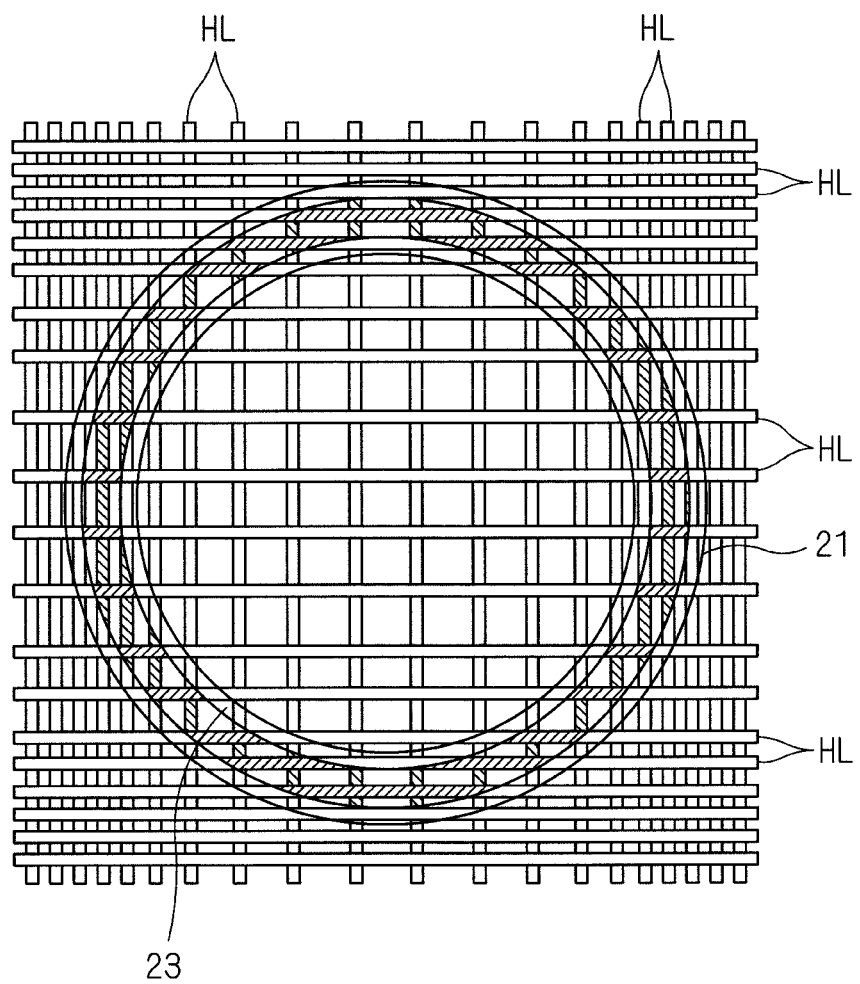
FIG. 9 illustrates portions of halogen lamps where reflectors are provided according to a first preferred embodiment.

In the first preferred embodiment, multiple halogen lamps HL of the halogen heater 4 have reflectors in areas of their lamp tube walls that face the spacing between the inner wall surface of the outer louver 21 and the outer wall surface of the inner louver 23. FIG. 9 illustrates the areas of the halogen lamps HL in which the reflectors are provided, according to the first preferred embodiment. FIG. 9 illustrates the outer louver 21 and the inner louver 23 that are projected from above on the array of the multiple halogen lamps HL illustrated in FIG. 7. In FIG. 9, the reflectors are provided in areas with hatching. As illustrated in FIG. 9, the reflectors are provided on only part of the lamp tube walls of the multiple halogen lamps HL, and more specifically, only areas of the lamp tube parts of the halogen lamps HL that face the spacing between the inner wall surface of the outer louver 21 and the outer wall surface of the inner louver 23. That is, in the first preferred embodiment, the halogen lamps HL that face the spacing include areas with reflectors provided on the lamp tube wall, and areas with no reflectors.

Figure 10:
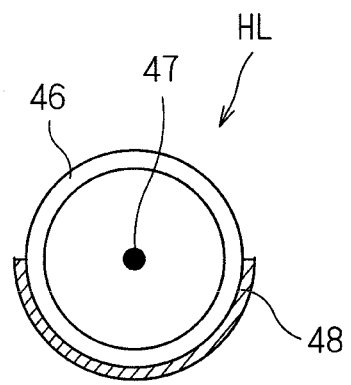
FIG. 10 is a cross-sectional view of the areas of the halogen lamps in which the reflectors are provided.

FIG. 10 is a cross-sectional view of the area of a halogen lamp HL that is provided with a reflector. An arc-shaped reflector 48 is provided on the lower half of the outer circumferential wall surface of a glass tube 46 of the halogen lamp HL. The reflector 48 is a silica ($SiO_2$) film formed by, for example, coating. The inner surface (interface with the tube wall of the glass tube 46) of such a silica film that is formed by coating on the outer wall surface of the smooth glass tube 46 has large reflective power and functions as a reflector. The reflector 48 reflects the light emitted from a filament 47 of the halogen lamp HL in an upward direction, i.e., toward the spacing between the inner wall surface of the outer louver 21 and the outer wall surface of the inner louver 23.

Referring back to FIG. 1, the controller 3 controls the above-described various operating mechanisms of the heat treatment apparatus 1. The controller 3 has a similar hardware configuration to that of a typical computer. That is, the controller 3 includes a CPU that is a circuit for performing various types of computations, a ROM that is a read-only memory for storing basic programs, a RAM that is a readable/writable memory for storing various types of information, and a magnetic disk for storing control software and control data. The processing of the heat treatment apparatus 1 is implemented by the CPU of the controller 3 executing predetermined processing programs.

The heat treatment apparatus 1 also includes, in addition to the above-described configuration, various cooling structures in order to prevent an excessive temperature increase in the halogen heater 4, the flash heater 5, and the chamber 6 due to heat energy generated by the halogen lamps HL and the flash lamps FL during the heat treatment of the semiconductor wafer W. For example, the chamber 6 may have a water-cooled tube (not shown) in the wall. The halogen heater 4 and the flash heater 5 may have an air cooling structure for exhausting heat by forming an internal flow of gas. Moreover, air may be supplied to the spacing between the upper chamber window 63 and the lamp-light irradiation window 53 to cool the flash heater 5 and the upper chamber window 63.

Next is a description of the procedure of processing performed on the semiconductor wafer W by the heat treatment apparatus 1. The semiconductor wafer W to be processed here is a semiconductor substrate that is doped with impurities (ions) by ion implantation. These impurities are activated by flash light irradiation and heat treatment (annealing) performed by the heat treatment apparatus 1. The following procedure of processing performed by the heat treatment apparatus 1 is implemented by the controller 3 controlling the operating mechanisms of the heat treatment apparatus 1.

First, the valve 84 for supplying a gas and the valves 89 and 192 for exhausting a gas are opened to start the supply and exhaust of gases into and from the chamber 6. When the valve 84 is open, a nitrogen gas is supplied from the gas supply port 81 to the heat treatment space 65. When the valve 89 is open, the gas in the chamber 6 is exhausted from the gas exhaust port 86. Thereby, the nitrogen gas supplied from the upper part of the heat treatment space 65 in the chamber 6 flows downward and is exhausted from the lower part of the heat treatment space 65.

When the valve 192 is open, the gas in the chamber 6 is also exhausted from the transport opening 66. Moreover, the atmosphere around the driving part of the transfer mechanism 10 is also exhausted by an exhaust mechanism (not shown). During the heat treatment of the semiconductor wafer W by the heat treatment apparatus 1, the nitrogen gas continues to be supplied to the heat treatment space 65, and the amount of the nitrogen gas supplied is appropriately changed depending on the processing step.

Then, the gate valve 185 is opened to open the transport opening 66, and the ion-implanted semiconductor wafer W is transported into the heat treatment space 65 of the chamber 6 through the transport opening 66 by a transport robot located outside the apparatus. The semiconductor wafer W transported into the heat treatment space 65 by the transport robot is moved to a position directly above the holder 7 and stopped. Then, the pair of transfer arms 11 of the transfer mechanism 10 move horizontally from the retracted positions to the transfer operation positions and upward, so that the lift pins 12 pass through the through holes 79 and protrude from the upper surface of the holding plate 75 of the susceptor 74 to receive the semiconductor wafer W. At this time, the lift pins 12 are elevated to a position above the upper end of the substrate support pins 77.

After the semiconductor wafer W is placed on the lift pins 12, the transport robot is withdrawn from the heat treatment space 65, and the transport opening 66 is closed by the gate valve 185. Then, the pair of transfer arms 11 move downward so that the semiconductor wafer W is transferred from the transfer mechanism 10 to the susceptor 74 of the holder 7 and held in a horizontal position from the underside. The semiconductor wafer W is supported by the multiple substrate support pins 77 provided upright on the holding plate 75 and held by the susceptor 74. The semiconductor wafer W is held by the holder 7 such that its patterned and impurity-doped front surface faces upward. A predetermined spacing is provided between the rear surface (major surface opposite the front surface) of the semiconductor wafer W supported by the multiple substrate support pins 77 and the holding surface 75a of the holding plate 75. The pair of transfer arms 11 that have moved down to a position below the susceptor 74 are retracted to their retracted position, i.e., retracted to the inside of the recessed portion 62, by the horizontal movement mechanism 13.

After the semiconductor wafer W is held in a horizontal position from the underside by the susceptor 74 of the holder 7 made of quartz, all of the 40 halogen lamps HL of the halogen heater 4 are turned on in unison to start preheating (assist-heating). The halogen light emitted from the halogen lamps HL passes through the louver stage 22, the lower chamber window 64, and the susceptor 74, which are made of quartz, and is radiated from the rear surface (main surface on the opposite side to the front surface) of the semiconductor wafer W. The semiconductor wafer W that has received the light emitted from the halogen lamps HL is preheated, and thereby the temperature of the semiconductor wafer W rises. Note that the transfer arms 11 of the transfer mechanism 10 that have retracted to the inside of the recessed portion 62 will not impede the heating using the halogen lamps HL.

During the preheating using the halogen lamps HL, the temperature of the semiconductor wafer W is measured with the radiation thermometer 120. That is, the radiation thermometer 120 receives infrared light that is radiated from the rear surface of the semiconductor wafer W held by the susceptor 74 through the opening 78, and measures the increasing wafer temperature. The measured temperature of the semiconductor wafer W is transmitted to the controller 3. The controller 3 controls the output of the halogen lamps HL while monitoring whether the temperature of the semiconductor wafer W, which is rising by the radiation of light from the halogen lamps HL, has reached a predetermined preheating temperature T1. That is, the controller 3 performs feedback control of the output of the halogen lamps HL on the basis of the measured value obtained by the radiation thermometer 120, so that the temperature of the semiconductor wafer W will reach the preheating temperature T1. The preheating temperature T1 is set to a range of about 200° C. to 800° C. at which the impurities doped in the semiconductor wafer W will not be diffused by heat, and preferably, a range of about 350° C. to 600° C. (in the present preferred embodiment, 600° C.).

After the temperature of the semiconductor wafer W has reached the preheating temperature T1, the controller 3 temporarily maintains the semiconductor wafer W at the preheating temperature T1 for a while. More specifically, when the temperature of the semiconductor wafer W measured by the radiation thermometer 120 has reached the preheating temperature T1, the controller 3 adjusts the output of the halogen lamps HL so as to maintain the temperature of the semiconductor wafer W at approximately the preheating temperature T1.

In the first preferred embodiment, the path of light travelling from the halogen heater 4 toward the semiconductor wafer W held by the holder 7 is adjusted by providing the opaque cylindrical outer and inner louvers 21 and 23 between the halogen heater 4 and the chamber 6 and providing the reflectors 48 on part of the lamp tube walls of the halogen lamps HL. FIG. 11 illustrates how optical paths are adjusted by the outer and inner louvers 21 and 23 and the reflectors 48.

The outer louver 21 and the inner louver 23 are concentrically arranged on the louver stage 22 in a plan view, and the inner diameter of the outer louver 21 is greater than the outer diameter of the inner louver 23. Thus, there is a cylindrical spacing between the inner wall surface of the outer louver 21 and the outer wall surface of the inner louver 23 as illustrated in FIG. 11. In the present preferred embodiment, the spacing has a cylindrical shape with an outer diameter of 317 mm, an inner diameter of 283 mm, and a height of 23 mm as described above. The spacing between the inner wall surface of the outer louver 21 and the outer wall surface of the inner louver 23 is 17 mm.

The cylindrical spacing between the inner wall surface of the outer louver 21 and the outer wall surface of the inner louver 23 is located immediately below and faces the peripheral portion of the semiconductor wafer W held by the holder 7 in the chamber 6. As illustrated in FIG. 11, light that is emitted from the areas of the multiple halogen lamps HL of the halogen heater 4 that face the cylindrical spacing between the inner wall surface of the outer louver 21 and the outer wall surface of the inner louver 23 and enters the spacing will reach the peripheral portion of the semiconductor wafer W with high directivity. In the first preferred embodiment, the reflectors 48 are provided in the areas of the lamp tube walls of the multiple halogen lamps HL that face the spacing between the inner wall surface of the outer louver 21 and the outer wall surface of the inner louver 23. Thus, the illuminance of the light that reaches the peripheral portion of the semiconductor wafer W through the spacing between the inner wall surface of the outer louver 21 and the outer wall surface of the inner louver 23 will be higher than the illuminance of the light that reaches the central portion of the semiconductor wafer W through the inside of the inner louver 23. Accordingly, the peripheral portion of the semiconductor wafer W where a temperature drop is likely to occur will have higher illuminance than the inner region, and will be strongly heated during preheating using the halogen lamps HL. As a result, the peripheral portion of the semiconductor wafer W where a temperature drop is likely to occur is relatively strongly heated. This configuration effectively resolves the problem of unevenness in the in-plane temperature distribution of the semiconductor wafer W during preheating.

After the temperature of the semiconductor wafer W has reached the preheating temperature T1 and a predetermined period of time has elapsed, the flash lamps FL of the flash heater 5 emit flash light to the front surface of the semiconductor wafer W. At this time, part of the flash light emitted from the flash lamps FL travels directly into the chamber 6, and part of the flash light is once reflected by the reflector 52 and then travels into the chamber 6. Thus, flash heating of the semiconductor wafer W is implemented by this application of flash light.

Flash heating, which is implemented by the application of flash light from the flash lamps FL, can raise the front surface temperature of the semiconductor wafer W in a short time. That is, the flash light emitted from the flash lamps FL is an extremely short, strong flash of light that is obtained by converting the electrostatic energy stored in advance in the capacitor into an extremely short optical pulse and whose irradiation time is approximately in the range of 0.1 to 100 milliseconds. The front surface temperature of the semiconductor wafer W that is heated with the flash light emitted from the flash lamps FL will rise instantaneously to a processing temperature T2 of 1000° C. or higher and then drop rapidly after the impurities doped in the semiconductor wafer W are activated. In this way, the heat treatment apparatus 1 can raise and drop the front surface temperature of the semiconductor wafer W in an extremely short time, and therefore can activate the impurities doped in the semiconductor wafer W while suppressing the diffusion of the impurities due to heat. Since the time necessary to activate impurities is extremely shorter than the time necessary to diffuse impurities with heat, the activation of impurities will be completed in such a short time (e.g., about 0.1 to 100 milliseconds) that does not cause diffusion.

In the present preferred embodiment, the presence of the outer louver 21 and the inner louver 23 and the presence of the reflectors 48 in the areas of the lamp tube walls of the multiple halogen lamps HL that face the spacing between the louvers increases the illuminance in the peripheral portion of the semiconductor wafer W rather than the illuminance in the central portion. This configuration will help make uniform the in-plane temperature distribution of the semiconductor wafer W during preheating, and as a result make uniform the in-plane temperature distribution of the semiconductor wafer W during flash light irradiation.

After the flash heating ends and a predetermined period of time has elapsed, the halogen lamps HL are turned off. The temperature of the semiconductor wafer W thus rapidly drops from the preheating temperature T1. The decreasing temperature of the semiconductor wafer W is measured with the radiation thermometer 120, and the measurement result is transmitted to the controller 3. The controller 3 monitors the measurement result to determine whether the temperature of the semiconductor wafer W has dropped to a predetermined temperature. After the temperature of the semiconductor wafer W has dropped to the predetermined temperature or lower, the pair of transfer arms 11 of the transfer mechanism 10 move horizontally from the retracted positions to the transfer operation positions and upward again, so that the lift pins 12 protrude from the upper surface of the susceptor 74 and receive the heat-treated semiconductor wafer W from the susceptor 74. Then, the transport opening 66 that has been closed by the gate valve 185 is opened, and the semiconductor wafer W placed on the lift pins 12 is transported out of the apparatus by the transport robot. This completes the heat treatment of the semiconductor wafer W in the heat treatment apparatus 1.

In the first preferred embodiment, the opaque cylindrical outer and inner louvers 21 and 23 are provided between the halogen heater 4 and the chamber 6, and the reflectors 48 are provided in the areas of the lamp tube walls of the multiple halogen lamps HL that face the spacing between the inner wall surface of the outer louver 21 and the outer wall surface of the inner louver 23. The spacing between the louvers is located immediately below and faces the peripheral portion of the semiconductor wafer W held by the holder 7. Thus, the illuminance of the light that reaches the peripheral portion of the semiconductor wafer W from the halogen lamps HL will be higher than the illuminance of the light that travels toward the central portion of the semiconductor wafer W. Although the temperature of the peripheral portion of the semiconductor wafer tends to be lower than the temperature of the central portion during preheating using the halogen heater 4, the in-plane temperature distribution of the semiconductor wafer W during preheating can be made uniform by relatively increasing the illuminance of the light travelling toward the peripheral portion of the semiconductor wafer W. As a result, the in-plane temperature distribution of the semiconductor wafer W during flash heating can also be made uniform.

Second Preferred Embodiment

Next, a second preferred embodiment of the present invention will be described. The overall configuration of a heat treatment apparatus according to the second preferred embodiment is generally similar to that described in the first preferred embodiment. Also, the procedure of processing performed on the semiconductor wafer W according to the second preferred embodiment is the same as that described in the first preferred embodiment. The second preferred embodiment differs from the first preferred embodiment in the winding density of the filaments 47 of the halogen lamps HL. The rest of the configuration of the second preferred embodiment, excluding the winding density of the filaments 47, is the same as that described in the first preferred embodiment.

In the first preferred embodiment, the reflectors 48 are provided in the areas of the lamp tube walls of the multiple halogen lamps HL of the halogen heater 4 that face the spacing between the inner wall surface of the outer louver 21 and the outer wall surface of the inner louver 23. In the second preferred embodiment, in addition to this installation of the reflectors 48, the filaments 47 of the halogen lamps HL have a higher winding density in areas that face the spacing between the inner wall surface of the outer louver 21 and the outer wall surface of the inner louver 23 than in the other areas. Filaments with a high winding density have higher luminescence intensities than filaments with a low winding density. Thus, the illuminance of the light that reaches the peripheral portion of the semiconductor wafer W from the halogen lamps HL will be further higher than the illuminance of the light that travels toward the central portion of the semiconductor wafer W during preheating using the halogen heater 4. This configuration will help make uniform the in-plane temperature distribution of the semiconductor wafer W during preheating, and as a result make uniform the in-plane temperature distribution of the semiconductor wafer W during flash light irradiation.

Third Preferred Embodiment

Next, a third preferred embodiment according to the present invention will be described. The overall configuration of a heat treatment apparatus according to the third preferred embodiment is generally similar to that described in the first preferred embodiment. Also, the procedure of processing performed on the semiconductor wafer W according to the third preferred embodiment is the same as that described in the first preferred embodiment. The third preferred embodiment differs from the first preferred embodiment in the absence of the outer louver 21 and the inner louver 23 and the form of installation of reflectors in the halogen lamps HL.

FIG. 12 illustrates the halogen lamps HL provided with reflectors according to the third preferred embodiment. FIG. 12 illustrates that the semiconductor wafer W held by the holder 7 is projected from above on the array of the multiple halogen lamps HL illustrated in FIG. 7. In FIG. 12, the reflectors are provided in hatched areas. In the third preferred embodiment, the reflectors 48 are provided on the lamp tube walls of outer lamps 45 among the multiple rod-shaped halogen lamps HL of the halogen heater 4, the outer lamps 45 being lamps that do not completely overlap with the semiconductor wafer W held by the holder 7 as a whole in their longitudinal direction (along their entire lengths) in a plan view. In the third preferred embodiment, the reflectors 48 are provided on the lamp tube walls of the outer lamps 45 along the entire length thereof.

On the other hand, no reflectors 48 are provided on the rest of the multiple rod-shaped halogen lamps HL, excluding the outer lamps 45, i.e., on inner lamps 44 that overlap with the semiconductor wafer W held by the holder 7 in at least part of their entire lengths in a plan view. That is, unlike in the first preferred embodiment in which the lamp tube wall of a single halogen lamp HL may have both an area that includes a reflector and an area that does not include a reflector, the multiple halogen lamps HL in the third preferred embodiment are divided into halogen lamps that include the reflector 48 along the entire length and halogen lamps that do not include the reflector 48.

The form of installation of the reflectors 48 on the outer lamps 45 is the same as that described with reference to FIG. 10 in the first preferred embodiment. That is, the reflectors 48 of a silica film are provided in an arc shape on the lower halves of the outer wall surfaces of the glass tubes 46 of the halogen lamps HL. The reflectors 48 reflect the light emitted from the filaments 47 of the halogen lamps HL toward the peripheral portion of the semiconductor wafer W.

In the third preferred embodiment, the outer louver 21 and the inner louver 23 are not provided. Thus, there are no members that block off the light emitted from the halogen lamps HL, between the halogen heater 4 and the holder 7. The rest of the configuration of the third preferred embodiment, excluding the absence of the two louvers 21 and 23 and the form of installation of the reflectors 48, is the same as that described in the first preferred embodiment.

In the third preferred embodiment, the reflectors 48 are provided on the lamp tube walls of the outer lamps 45, which do not completely overlap with the semiconductor wafer W held by the holder 7 as a whole in their longitudinal direction in a plan view, among the multiple rod-shaped halogen lamps HL. Thus, when the multiple halogen lamps HL of the halogen heater 4 emit light, the intensity of light from the outer lamps 45 will be higher than the intensity of light from the inner lamps 44. This configuration allows the illuminance of light that reaches the peripheral portion of the semiconductor wafer W from the multiple halogen lamps HL to be higher than the illuminance of light that travels toward the central portion of the semiconductor wafer W, and therefore will help make uniform the in-plane temperature distribution of the semiconductor wafer W during preheating using the halogen heater 4. As a result, the in-plane temperature distribution of the semiconductor wafer W during flash heating can also be made uniform.

Fourth Preferred Embodiment

Next, a fourth preferred embodiment according to the present invention will be described. The overall configuration of a heat treatment apparatus according to the fourth preferred embodiment is generally similar to that described in the third preferred embodiment. Also, the procedure of processing performed on the semiconductor wafer W according to the fourth preferred embodiment is the same as that described in the first preferred embodiment. The fourth preferred embodiment differs from the third preferred embodiment in the winding density of the filaments 47 of the halogen lamps HL.

In the third preferred embodiment, the reflectors 48 are provided on the lamp tube walls of the outer lamps 45, which do not completely overlap with the semiconductor wafer W held by the holder 7 as a whole in their longitudinal direction in a plan view, among the multiple rod-shaped halogen lamps HL. In the fourth preferred embodiment, in addition to this form of installation of the reflectors 48, the filaments 47 of the outer lamps 45 have a higher winding density than the filaments 47 of the inner lamps 44. Thus, when the multiple halogen lamps HL of the halogen heater 4 emit light, the intensity of light from the outer lamps 45 will be further higher than the intensity of light from the inner lamps 44. This configuration allows the illuminance of light that reaches the peripheral portion of the semiconductor wafer W from the multiple halogen lamps HL to be further higher than the illuminance of light that travels toward the central portion of the semiconductor wafer W, and therefore will help make uniform the in-plane temperature distribution of the semiconductor wafer W during preheating using the halogen heater 4. As a result, the in-plane temperature distribution of the semiconductor wafer W during flash heating can also be made uniform.

Fifth Preferred Embodiment

Next, a fifth preferred embodiment according to the present invention will be described. The overall configuration of a heat treatment apparatus according to the fifth preferred embodiment is generally similar to that described in the third preferred embodiment. Also, the procedure of processing performed on the semiconductor wafer W according to the fifth preferred embodiment is the same as that described in the first preferred embodiment. The fifth preferred embodiment differs from the third preferred embodiment in lamp output of the halogen lamps HL.

In the third preferred embodiment, the reflectors 48 are provided on the lamp tube walls of the outer lamps 45, which do not completely overlap with the semiconductor wafer W held by the holder 7 as a whole in their longitudinal direction in a plan view, among the multiple rod-shaped halogen lamps HL. In the fifth preferred embodiment, in addition to this form of installation of the reflectors 48, the outer lamps 45 have higher output than the inner lamps 44. More specifically, the voltage applied to the outer lamps 45 is higher than the voltage applied to the inner lamps 44. Thus, when the multiple halogen lamps HL of the halogen heater 4 emit light, the intensity of light from the outer lamps 45 will be further higher than the intensity of light from the inner lamps 44. This configuration allows the illuminance of light that reaches the peripheral portion of the semiconductor wafer W from the multiple halogen lamps HL to be further higher than the illuminance of light that travels toward the central portion of the semiconductor wafer W, and therefore will help make uniform the in-plane temperature distribution of the semiconductor wafer W during preheating using the halogen heater 4. As a result, the in-plane temperature distribution of the semiconductor wafer W during flash heating can also be made uniform.

Variations

While the above has been a description of preferred embodiments of the present invention, various modifications other than the examples described above are possible without departing from the scope of the invention. For example, while in the above-described first and third preferred embodiments, the reflectors 48 formed on the outer wall surfaces of the glass tubes 46 of the halogen lamps HL are made of a silica film, the present invention is not limited to this example, and the reflectors 48 may be made of a metal film. The reflectors 48 made of a metal film will achieve high reflectivity because the interfaces between the tube walls of the glass tubes 46 and the reflectors 48 become mirror surfaces. In this case, however, both of the glass tubes 46 and the reflectors 48 will undesirably be heated to a considerably high temperature during light radiation from the halogen lamps HL. If the reflectors 48 are made of a silica film as in the above-described embodiments, the glass tubes 46 and the reflectors 48 will have the same coefficient of thermal expansion, and therefore it is possible to prevent the glass tubes 46 from being damaged due to thermal expansion.

In the fourth preferred embodiment, only the winding density of the filaments 47 of the outer lamps 45 may be increased without the installation of the reflectors 48. In the fifth preferred embodiment, only the output of the outer lamps 45 may be increased without the installation of the reflectors 48. Alternatively, a configuration is also possible in which the outer lamps 45 include the reflectors 48, the filaments 47 of the outer lamps 45 have a higher winding density, and the outer lamps 45 have higher output. After all, at least one of the followings, i.e., installation of the reflectors 48, higher winding density of the filaments 47, and higher output, may be adopted.

While the two louvers, namely, the outer louver 21 and the inner louver 23, are installed in the first and second preferred embodiments, the present invention is not limited to this example, and three or more louvers may be installed. In this case, the three or more louvers each may be a cylindrical member made of a material (e.g., opaque quartz) that is impervious to the light emitted from the halogen lamps HL. The three or more louvers may be installed between the halogen heater 4 and the holder 7, and more specifically, concentrically installed on the upper surface of the louver stage 22 as in the above-described preferred embodiments. In the presence of three or more louvers, reflectors may be provided in areas of the lamp tube walls of the multiple halogen lamps HL that face the spacing between each pair of louvers.

While in the above-described preferred embodiments, the flash heater 5 includes 30 flash lamps FL, the present invention is not limited to this example, and the flash heater 5 may include an arbitrary number of flash lamps FL. The flash lamps FL are not limited to xenon flash lamps, and may be krypton flash lamps. The number of halogen lamps HL included in the halogen heater 4 is also not limited to 40, and the halogen heater 4 may include an arbitrary number of halogen lamps HL as long as each of the upper and lower rows includes an array of multiple halogen lamps.

Substrates to be processed by the heat treatment apparatus according to the present invention are not limited to semiconductor wafers, and may be glass substrates for use in flat panel displays such as liquid crystal displays, or may be substrates for solar cells. The technique according to the present invention is also applicable to other applications such as heat treatment of a high dielectric gate insulating film (High-k film), bonding of metal and silicon, and crystallization of polysilicon.

The application of the heat treatment technique of the present invention is not limited to flash-lamp annealing apparatuses, and this technique is also applicable to, for example, lamp annealing apparatuses using halogen lamps or apparatuses, such as CVD apparatuses, that use different heat sources other than flash lamps. In particular, the technique of the present invention is preferably applicable to backside annealing apparatuses in which halogen lamps are located below a chamber and heat treatment is performed with the light emitted from the rear surface of the semiconductor wafer.

While the invention has been shown and described in detail, the foregoing description is in all aspects illustrative and not restrictive. It is therefore to be understood that numerous modifications and variations can be devised without departing from the scope of the invention.

What is claimed is:

1. A heat treatment apparatus for heating a disk-shaped substrate by irradiating the substrate with light, comprising:
   a chamber that houses a substrate;
   a holder that holds said substrate within said chamber;
   a light irradiation part in which a plurality of rod-shaped lamps are arranged in a light source region that includes a region that faces a major surface of said substrate held by said holder;
   a cylindrical first louver that is provided between said light irradiation part and said holder, with a central axis of said first louver passing through a center of said substrate, and that is impervious to light emitted from said light irradiation part; and
   a cylindrical second louver that is provided between said light irradiation part and said holder, with a central axis of said second louver passing through the center of said substrate, and that is impervious to the light emitted from said light irradiation part,
   wherein said first louver and said second louver have the same height,
   said first louver has an inner diameter that is greater than an outer diameter of said second louver,
   said second louver is provided inside said first louver,
   said first louver and said second louver are provided with a spacing between an inner wall surface of said first louver and an outer wall surface of said second louver,
   said spacing facing a peripheral portion of said substrate, and
   a reflector that reflects light emitted from said plurality of rod-shaped lamps toward said spacing is provided in an area of lamp tube walls of said plurality of rod-shaped lamps that faces said spacing.

2. The heat treatment apparatus according to claim 1, wherein
   a winding density of filaments of said plurality of rod-shaped lamps in an area that faces said spacing is higher than a winding density thereof in the other area.

3. A heat treatment apparatus for heating a disk-shaped substrate by irradiating the substrate with light, comprising:
   a chamber that houses a substrate;
   a holder that holds said substrate within said chamber; and
   a light irradiation part in which a plurality of rod-shaped lamps are arranged in a light source region that includes a region that faces a major surface of said substrate held by said holder,
   wherein, among said plurality of rod-shaped lamps, only an outer lamp has a reflector on a lamp tube wall of said outer lamp, said reflector reflecting light emitted from said outer lamp toward said substrate, and said outer lamp being a lamp that does not completely overlap with said substrate as a whole in a longitudinal direction of said outer lamp in a plan view.

4. The heat treatment apparatus according to claim 3, wherein
   a winding density of a filament of said outer lamp is higher than a winding density of filaments of the other lamps among said plurality of rod-shaped lamps, excluding said outer lamp.

5. The heat treatment apparatus according to claim 3, wherein
   said outer lamp has higher output than the other lamps among said plurality of rod-shaped lamps, excluding said outer lamp.

* * * * *